US008643027B2

(12) United States Patent
Lal et al.

(10) Patent No.: US 8,643,027 B2
(45) Date of Patent: Feb. 4, 2014

(54) MILLED PARTICLE COMPOSITIONS AND RELATED METHODS AND STRUCTURES

(75) Inventors: Archit Lal, Ithaca, NY (US); Robert J. Dobbs, Newfield, NY (US)

(73) Assignee: Primet Precision Materials, Inc., Ithaca, NY (US)

(*) Notice: Subject to any disclaimer, the term of this patent is extended or adjusted under 35 U.S.C. 154(b) by 532 days.

(21) Appl. No.: 11/634,520

(22) Filed: Dec. 6, 2006

(65) Prior Publication Data

US 2007/0178306 A1 Aug. 2, 2007

Related U.S. Application Data

(60) Provisional application No. 60/742,721, filed on Dec. 6, 2005.

(51) Int. Cl.
*H01L 27/15* (2006.01)
(52) U.S. Cl.
USPC ...... 257/79; 977/773; 977/915; 257/E31.027; 438/63; 438/687; 438/812
(58) Field of Classification Search
USPC .............. 257/E31.027, 79; 438/812, 63, 687; 977/915, 975
See application file for complete search history.

(56) References Cited

U.S. PATENT DOCUMENTS

| 6,329,540 | B1* | 12/2001 | Kim et al. ........................ 556/1 |
| 2003/0144163 | A1* | 7/2003 | Morinaga et al. ............. 510/175 |
| 2003/0224214 | A1* | 12/2003 | Garito et al. ........... 428/694 ML |
| 2005/0238562 | A1* | 10/2005 | Ponce et al. .................. 423/409 |

FOREIGN PATENT DOCUMENTS

JP 2005-290377 * 10/2008 ............. C09K 11/81

* cited by examiner

*Primary Examiner* — Mark A Laurenzi
(74) *Attorney, Agent, or Firm* — Wolf, Greenfield & Sacks, P.C.

(57) ABSTRACT

Small particle compositions including nanoparticle compositions are provided. The particle compositions, in some cases, are characterized by having an extremely small average particle size (e.g., 150 nanometers or less). The small particles may comprise a semiconductor material and/or a light-emitting material. In some embodiments, the particles may be in the form a preferred shape including platelets, amongst others. The small particle compositions may be produced in a milling process. In some embodiments, the milling process uses preferred types of grinding media to form milled particles having desired characteristics (e.g., particle size, shape). The small (or nano) particle compositions may be used in a variety of different applications including light-emitting applications. In certain applications, it may be desirable to form thin films from the small particle compositions.

12 Claims, 3 Drawing Sheets

MILLED PARTICLE COMPOSITIONS AND RELATED METHODS AND STRUCTURES

RELATED APPLICATIONS

This application claims priority to U.S. Patent Application Ser. No. 60/742,721, filed on Dec. 6, 2005, which is incorporated herein by reference.

FIELD OF INVENTION

The invention relates to generally to small particle compositions and, more particularly, to milled small particle compositions, as well as methods and structures associated with the same.

BACKGROUND OF INVENTION

Milling processes typically use grinding media to crush, or beat, a product material to smaller dimensions. For example, the product material may be provided in the form of a powder having relatively large particles and the milling process may be used to reduce the size of the particles.

Grinding media may have a variety of sizes and shapes. In a typical milling process, the grinding media are used in a device known as a mill (e.g., ball mill, rod mill, attritor mill, stirred media mill, pebble mill, and alike). Mills typically operate by distributing product material around the grinding media and rotating to cause collisions between grinding media that fracture product material particles into smaller dimensions to produce a milled product.

Semiconductor materials and/or light-emitting materials can be formed as thin film coatings. Thin film coatings are typically made using conventional deposition processes such as vapor deposition and/or reactive deposition, amongst others. These conventional processes may have certain disadvantages including being expensing and/or needing complex equipment.

SUMMARY OF INVENTION

The invention provides small particle composition, as well as methods and structures associated with the same.

In one aspect of the invention, a milled particle composition is provided. The composition comprises milled particles comprising a semiconductor material and having an average particle size of less than 150 nm. In some embodiments, the particles have a platelet shape.

In one aspect of the invention, a milled particle composition is provided. The composition comprises milled particles comprising a light-emitting material and having an average particle size of less than 150 nm. In some embodiments, the particles have a platelet shape.

In one aspect of the invention, a thin film is provided. The thin film comprises milled particles comprising a semiconductor material and having an average particle size of less than 150 nm. In some embodiments, the particles have a platelet shape.

In one aspect of the invention, a method of forming a particle composition is provided. The method comprises milling feed particles to form milled particles comprising a semiconductor material. The milled particles have an average particle size of less than 150 nm. In some embodiments, the particles have a platelet shape.

In one aspect of the invention, a method of forming a particle composition is provided. The method comprises milling feed particles to form milled particles comprising a light-emitting material. The milled particles have an average particle size of less than 150 nm. In some embodiments, the particles have a platelet shape.

Other aspects, embodiments and features of the invention will become apparent from the following detailed description when considered in conjunction with the accompanying drawings. The accompanying figures are schematic and are not intended to be drawn to scale. For purposes of clarity, not every component is labeled in every figure. Nor is every component of each embodiment of the invention shown where illustration is not necessary to allow those of ordinary skill in the art to understand the invention. All patent applications and patents incorporated herein by reference are incorporated by reference in their entirety. In case of conflict, the present specification, including definitions, will control.

DETAILED DESCRIPTION OF INVENTION

Figure 1:
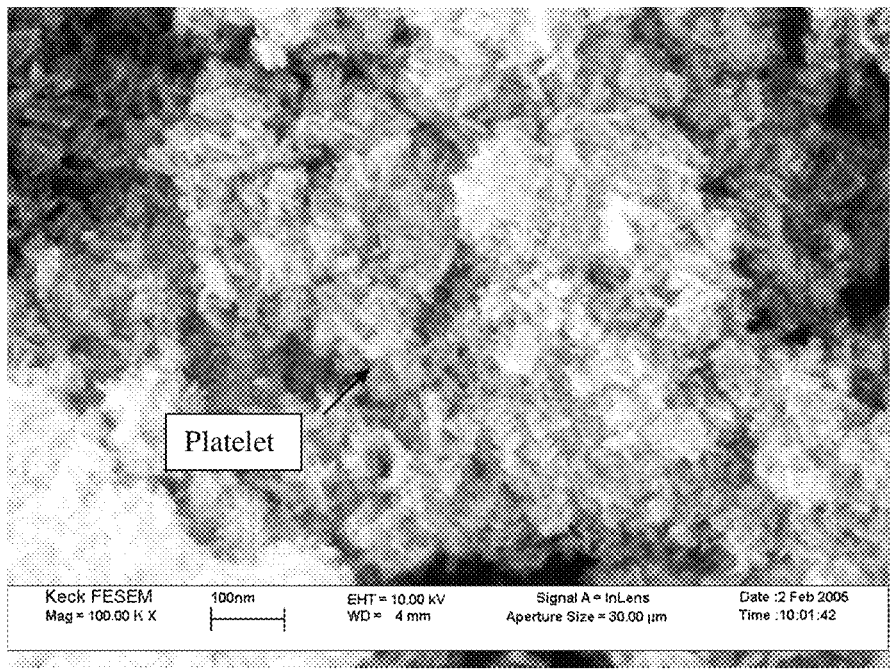
FIG. 1 is a copy of a HRSEM image of GaN nanoparticles as described in Example 1.

The invention provides small particle compositions including nanoparticle compositions. The particle compositions, in some cases, are characterized by having an extremely small average particle size (e.g., 150 nanometers or less). The small particles may comprise a semiconductor material and/or a light-emitting material. In some embodiments, the particles may be in the form a preferred shape including platelets, amongst others. As described further below, the small particle compositions may be produced in a milling process. In some embodiments, the milling process uses preferred types of grinding media to form milled particles having desired characteristics (e.g., particle size, shape). The small particle compositions may be used in a variety of different applications including light-emitting applications. In certain applications, it may be desirable to form thin films from the small particle compositions.

The particle compositions may be produced at small particle sizes. In some embodiments, the average particle size of the composition is less than 1 micron. In certain embodiments, the average particle size may be even smaller. For example, the average particle size may be less than 600 nm, less than 250 nm, or less than 150 nm. In some embodiments, it may be preferred for the particle compositions to have very small particle sizes (e.g., an average particle size of less than 150 nm). In some cases, it is even possible to produce particle compositions having an average particle size of less than 50 nm, or less than 10 nm. Such particle sizes may be obtained, in part, by using grinding media having certain preferred characteristics, as described further below.

The preferred average particle size of the composition typically depends on the intended application. In certain applications, it may be desired for the average particle size to be extremely small (e.g., less than 150 nm); while, in other applications, it may be desired for the average particle size to be slightly larger (e.g., between 150 nm and 1 micron). In general, milling parameters may be controlled to provide a desired particle size, though in certain cases it may be preferable for the average particle size to be greater than 1 nm to facilitate milling. For example, the average particle size of the milled material may be controlled by a number of factors including grinding media characteristics (e.g., density, size, hardness, toughness), as well as milling conditions (e.g., specific energy input).

It should be understood that the average particle size of a particle composition may be determined by measuring an average cross-sectional dimension (e.g., diameter for substantially spherical particles) of a representative number of particles. For example, the average cross-sectional dimension of a substantially spherical particle is its diameter; and, the average cross-sectional dimension of a non-spherical particle is the average of its three cross-sectional dimensions (e.g., length, width, thickness), as described further below. The particle size may be measured using a laser particle measurement instrument, a scanning electron microscope or other conventional techniques.

It should also be understood that particle compositions having average particle sizes outside the above-described ranges (e.g., greater than 1 micron) may be useful in certain embodiments of the invention.

The particle compositions may also be relatively free of large particles. That is, the particle compositions may include only a small concentration of larger particles. For example, the $D_{90}$ values for the compositions may be any of the above-described average particle sizes. Though, it should be understood that the invention is not limited to such $D_{90}$ values.

The particle compositions may also have a very high average surface area. The high surface area is, in part, due to the very small particle sizes noted above. The average surface area of the particle compositions may be greater than 1 $m^2/g$; in other cases, greater than 5 $m^2/g$; and, in other cases, greater than 50 $m^2/g$. In some cases, the particles may have extremely high average surface areas of greater than 100 $m^2/g$; or, even greater than 500 $m^2/g$. It should be understood that these high average surface areas are even achievable in particles that are substantially non-porous, though other particles may have surface pores. Such high surface areas may be obtained, in part, by using grinding media having certain preferred characteristics, as described further below.

Similar to particle size, the preferred average surface area of the particle composition typically depends on the intended application. In certain applications, it may be desired for the average surface area to be extremely large (e.g., greater than 50 $m^2/g$); while, in other applications, it may be desired for the average surface area to be slightly smaller (e.g., between 50 $m^2/g$ and 1 $m^2/g$). In general, milling parameters may be controlled to provide a desired surface area, though in certain cases it may be preferable for the average surface area to be less than 3,000 $m^2/g$ (e.g., for substantially non-porous particles). For example, the average surface area of the milled particle compositions may be controlled by a number of factors including grinding media characteristics (e.g., density, size, hardness, toughness), as well as milling conditions (e.g., energy, time).

As described further below, the particles of the present invention can be produced in a milling process. Thus, these particle compositions may be described as having a characteristic "milled" morphology/topology. Those of ordinary skill in the art can identify "milled particles" as particles that include one or more of the following microscopic features: multiple sharp edges, faceted surfaces, and being free of smooth rounded "corners" such as those typically observed in chemically-precipitated particles. It should be understood that the milled particles described herein may have one or more of the above-described microscopic features, while having other shapes (e.g., platelet) when viewed at lower magnifications.

In some embodiments, it may be preferable for the particles to have a platelet shape. In these cases, the particles may have a relatively uniform thickness across the length of the particle. The particles may have a substantially planar first surface and a substantially planar second surface with the thickness extending therebetween. The particle thickness may be smaller than the particle width and particle length. In some embodiments, the length and width may be approximately equal; however, in other embodiments the length and width may be different. In cases where the length and width are different, the platelet particles may have a rectangular box shape. In certain cases, the particles may be characterized as having sharp edges. For example, the angle between a top surface (e.g., first planar surface) of the particle and a side surface of the particle may be between 75° and 105°; or between 85° and 95° degrees (e.g., about 90°).

However, it should be understood that the particles may not have platelet shapes in all embodiments and that the invention is not limited in this regard. For example, the particles may have a substantially spherical or oblate spheroid shape, amongst others. It should be understood that within a milled particle composition, individual particles may be in the form of one or more of the above-described shapes.

The small particle compositions may have a variety of suitable chemical compositions. In some embodiments, the particles are formed of a semiconductor material. In certain embodiments, the semiconductor material may be a wide band gap semiconductor material. The semiconductor material may be a Group III-V compound including Group III-nitrides such as a gallium nitride material (e.g., GaN). As used herein, a gallium nitride material may be GaN or any of its alloys. The semiconductor material may be doped with conventional dopants; or, may be un-doped. Other suitable materials include light-emitting materials which may or may not be semiconductor materials such phosphor materials including zinc sulfide (ZnS) and $Sr_4A_{11}4O_{25}$. ZnS may be, for example, doped with Mn, Al, Ag and Cu and $Sr_4A_{11}4O_{25}$ may be Eu-doped.

An advantage of certain embodiments of the invention is that the above-noted particle sizes can be achieved at very low contamination levels. The grinding media noted below may enable the low contamination levels when used with the above-described compositions because such characteristics lead to very low wear rates. For example, the milled compositions may have contamination levels may be less than 900 ppm, less than 500 ppm, less than 200 ppm, or even less than 100 ppm. In some processes, virtually no contamination may be detected which is generally representative of contamination levels of less than 10 ppm. As used herein, a "contaminant" is grinding media material introduced into the product material composition during milling. It should be understood that typical commercially available product materials may include a certain impurity concentration (prior to milling) and that such impurities are not includes in the definition of contaminant as used herein. Also, other sources of impurities introduced in to the product material, such as material from the milling equipment, are not included in the definition of contaminant as used herein. The "contamination level" refers to the weight concentration of the contaminant relative to the weight concentration of the milled material. Typical units for the contamination level are ppm. Standard techniques for measuring contamination levels are known to those of skill in the art including chemical composition analysis techniques.

It should be understood that methods of the invention may produce compositions having any of the particle size values described herein (including values of relative size between particles before and after milling) combined with any of the above-described contamination levels. For example, one method of the invention involves milling feed particles having an average initial particle size to form a milled particle composition having an average final particle size of less than 100 nm, wherein the initial particle size is greater than 100 times the final particle size and the milled particle composition has a contamination level of less than 500 ppm.

In some embodiments, the compositions of the invention may comprise particles having a preferred crystallographic orientation. Suitable methods of forming the such particles have been described in commonly-owned, co-pending U.S. Provisional Patent Application Ser. No. 11/318,341, filed on Dec. 23, 2005, which is incorporated herein by reference. In some embodiments, a majority (i.e., greater than 50%) of the particles in a composition may have the same crystallographic orientation. In other embodiments, greater than 75% of the particles, or even greater than 95%, or even substantially all, of the particles in a composition may have the same crystallographic orientation.

The preferred crystallographic orientation of the particles may depend, in part, on the crystal structure (e.g., hexagonal, tetragonal) of the material that forms the particles. Crystals generally preferentially fracture along specific planes with characteristic amounts of energy being required to induce fracture along such planes. During milling, such energy results from particle/grinding media collisions. It is observed that, by controlling the energy of such collisions via milling parameters (e.g., grinding media composition, specific energy input), it is possible to preferentially fracture particles along certain crystallographic planes which creates a particle composition having a preferred crystallographic orientation.

In some embodiments, the preferred crystallographic orientation is defined by a basal plane (i.e., the plane which is perpendicular to the principal axis (c axis) in a tetragonal or hexagonal structure). For example, the basal plane, and crystallographic orientation, may be the (0001) or (001) plane.

In some embodiments, the preferred crystallographic orientation of particles comprising a gallium nitride material (e.g., GaN) is (002).

Crystallographic orientation of particles may be measured using known techniques. A suitable technique is x-ray diffraction (XRD). It may be possible to assess the relative percentage of particles having the same preferred crystallographic orientation using XRD.

Particle compositions having a preferred crystallographic orientation may be particularly desired when the compositions are used in light-emitting applications. Because certain planes can exhibit enhanced light emission, it may be possible to significantly increase the overall light emission of a particle composition by exposing such planes.

As noted above, it may be preferred to use grinding media having specific characteristics. However, it should be understood that not every embodiments of the invention is limited in this regard. In some embodiments, the grinding media is formed of a material having a density of greater than 6 grams/cm$^3$; in some embodiments, greater than 8 grams/cm$^3$; in some embodiments, the density is greater than 10 grams/cm$^3$; or greater than 15 grams/cm$^3$; or, even, greater than 18 grams/cm$^3$. Though, in certain embodiments, the density of the grinding media may be less than 22 grams/cm$^3$, in part, due to difficulties in producing suitable grinding materials having greater densities. It should be understood that conventional techniques may be used to measure grinding media material density.

In certain embodiments, it also may be preferable for the grinding media to be formed of a material having a high fracture toughness. For example, in some cases, the grinding media is formed of a material having a fracture toughness of greater than 6 MPa/m$^{1/2}$; and in some cases, the fracture toughness is greater than 9 MPa/m$^{1/2}$. The fracture toughness may be greater than 12 MPa/m$^{1/2}$ in certain embodiments. Conventional techniques may be used to measure fracture toughness. Suitable techniques may depend, in part, on the type of material being tested and are known to those of ordinary skill in the art. For example, an indentation fracture toughness test may be used. Also, a Palmqvist fracture toughness technique may be suitable, for example, when testing hard metals.

It should be understood that the fracture toughness values disclosed herein refer to fracture toughness values measured on bulk samples of the material. In some cases, for example, when the grinding media are in the form of very small particles (e.g., less than 150 micron), it may be difficult to measure fracture toughness and the actual fracture toughness may be different than that measured on the bulk samples.

In certain embodiments, it also may be preferable for the grinding media to be formed of a material having a high hardness. It has been found that media having a high hardness can lead to increased energy transfer per collision with product material which, in turn, can increase milling efficiency. In some embodiments, the grinding media is formed a material having a hardness of greater than 75 kgf/mm$^2$; and, in some cases, the hardness is greater than 200 kgf/mm$^2$. The hardness may even be greater than 900 kgf/mm$^2$ in certain embodiments. Conventional techniques may be used to measure hardness. Suitable techniques depend, in part, on the type of material being tested and are known to those of ordinary skill in the art. For example, suitable techniques may include Rockwell hardness tests or Vickers hardness tests (following ASTM 1327). It should be understood that the hardness values disclosed herein refer to hardness values measured on bulk samples of the material. In some cases, for example, when the grinding media are in the form of very small particles (e.g., less than 150 micron), it may be difficult to measure hardness and the actual hardness may be greater than that measured on the bulk samples.

It should be understood that not all milling processes of the present invention use grinding media having each of the above-described characteristics.

Milling processes of the invention may use grinding media having a wide range of dimensions. In general, the average size of the grinding media is between about 0.5 micron and 10 cm. The preferred size of the grinding media used depends of a number of factors including the size of the feed particles, desired size of the milled particle composition, grinding media composition, and grinding media density, amongst others.

In certain embodiments, it may be advantageous to use grinding media that are very small. It may be preferred to use grinding media having an average size of less than about 250 microns; or, less than about 150 microns (e.g., between about 75 and 125 microns). In some cases, the grinding media may have an average size of less than about 100 microns; or even less than about 10 microns. Grinding media having a small size have been shown to be particularly effective in producing particle compositions having very small particle sizes (e.g., less than 1 micron). In some cases, the grinding media may have an average size of greater than 0.5 micron.

It should be understood that the average size of grinding media used in a process may be determined by measuring the average cross-sectional dimension (e.g., diameter for substantially spherical grinding media) of a representative number of grinding media particles. The grinding media size may be measured using conventional techniques such as suitable microscopy techniques or standard sieve size screening techniques.

The grinding media may also have a variety of shapes. In general, the grinding media may have any suitable shape known in the art. In some embodiments, it is preferred that the grinding media be substantially spherical (which may be used herein interchangeably with "spherical"). Substantially spherical grinding media have been found to be particularly effective in obtaining desired milling performance.

It should also be understood that any of the grinding media used in methods of the invention may have any of the characteristics (e.g., properties, size, shape, composition) described herein in combination with one another. For example, grinding media used in methods of the invention may have any of the above-noted densities and above-noted average sizes (e.g., grinding media may have a density of greater than about 6 grams/cm$^3$ and an average size of less than about 250 micron).

The above-described grinding media characteristics (e.g., density, hardness, toughness) are dictated, in part, by the composition of the grinding media. In certain embodiments, the grinding media may be formed of a metallic material including metal alloys or metal compounds. In one set of embodiments, it may be preferred that the grinding media are formed of ferro-tungsten material (i.e., Fe—W). In some cases, the compositions may comprise between 75 and 80 weight percent iron and between 20 and 25 weight percent tungsten. In some cases, ferro-tungsten grinding media may be carburized to improve wear resistance.

In other embodiments, the grinding media may be formed of a ceramic material such as a carbide material. In some embodiments, the grinding media to be formed of a single carbide material (e.g., iron carbide ($Fe_3C$), chromium carbide ($Cr_7C_3$), molybdenum carbide ($Mo_2C$), tungsten carbide (WC, $W_2C$), niobium carbide (NbC), vanadium carbide (VC), and titanium carbide (TiC)). In some cases, it may be preferred for the grinding media to be formed of a multi-carbide material. A multi-carbide material comprises at least two carbide forming elements (e.g., metal elements) and carbon.

A multi-carbide material may comprise a multi-carbide compound (i.e., a carbide compound having a specific stoichiometry; or, a blend of single carbide compounds (e.g., blend of WC and TiC); or, both a multi-carbide compound and a blend of single carbide compounds. It should be understood that multi-carbide materials may also include other components such as nitrogen, carbide-forming elements that are in elemental form (e.g., that were not converted to a carbide during processing of the multi-carbide material), amongst others including those present as impurities. Typically, but not always, these other components are present in relatively minor amounts (e.g., less than 10 atomic percent).

Suitable carbide-forming elements in multi-carbide grinding media of the invention include iron, chromium, hafnium, molybdenum, niobium, rhenium, tantalum, titanium, tungsten, vanadium, zirconium, though other elements may also be suitable. In some cases, the multi-carbide material comprises at least two of these elements. For example, in some embodiments, the multi-carbide material comprises tungsten, rhenium and carbon; in other cases, tungsten, hafnium and carbon; in other cases, molybdenum, titanium and carbon.

Suitable grinding media compositions have been described, for example, in U.S. patent application Ser. No. 11/193,688, filed on Jul. 29, 2005, entitled "Grinding Media Compositions and Methods Associated With the Same", which is incorporated herein by reference.

In some embodiments, it may be preferred for the multi-carbide material to comprise at least tungsten, titanium and carbon. In some of these cases, the multi-carbide material may consist essentially of tungsten, titanium and carbon, and is free of additional elements in amounts that materially affect properties. Though in other cases, the multi-carbide material may include additional metal carbide forming elements in amounts that materially affect properties. For example, in these embodiments, tungsten may be present in the multi-carbide material in amounts between 10 and 90 atomic %; and, in some embodiments, in amounts between 30 and 50 atomic %. The amount of titanium in the multi-carbide material may be between 1 and 97 atomic %; and, in some embodiments, between 2 and 50 atomic %. In these embodiments that utilize tungsten-titanium carbide multi-carbide material, the balance may be carbon. For example, carbon may be present in amounts between 10 and 40 atomic %. As noted above, it should also be understood that any other suitable carbide forming elements can also be present in the multi-carbide material in these embodiments in addition to tungsten, titanium and carbon. In some cases, one or more suitable carbide forming elements may substitute for titanium at certain sites in the multi-carbide crystal structure. Hafnium, niobium, tantalum and zirconium may be particularly preferred as elements that can substitute for titanium. Carbide-forming elements that substitute for titanium may be present, for example, in amounts of up to 30 atomic % (based on the multi-carbide material). In some cases, suitable multi-carbide elements may substitute for tungsten at certain sites in the multi-carbide crystal structure. Chromium, molybdenum, vanadium, tantalum, and niobium may be particularly preferred as elements that can substitute for tungsten. Carbide-forming elements that substitute for tungsten may be present, for example, in amounts of up to 30 atomic % (based on the multi-carbide material). It should also be understood that the substituting carbide forming elements noted above may completely substitute for titanium and/or tungsten to form a multi-carbide material free of tungsten and/or titanium.

It should be understood that grinding media compositions that are not disclosed herein but have certain above-noted characteristics (e.g., high density) may be used in embodiments of the invention. Also, it should be understood that milling processes of the present invention are not limited to the grinding media compositions and/or characteristics described herein. Other suitable grinding media may also be used.

In general, any suitable process for forming grinding media compositions may be used. In some cases, the processes involve heating the components of the composition to temperatures higher than the respective melting temperatures of the components followed by a cooling step to form the grinding media. A variety of different heating techniques may be used including a thermal plasma torch, melt atomization, and arc melting, amongst others. For example, one suitable process involves admixing fine particles of the elements intended to comprise the grinding media in appropriate ratios. The stability of the mixture may be enhanced by introduction of an inert binding agent (e.g., which burns off and does not form a component of the grinding material). The mixture may be subdivided into a plurality of aggregates (e.g., each having a mass approximately equal to that of the desired media particle to be formed). The aggregates may be heated to fuse (e.g., to 90% of theoretical density) and, eventually, melt individual aggregates to form droplets that are cooled to form the grinding media. In some embodiments, the grinding media may be formed of two different materials. For example, the grinding media may be formed of a blend of two different ceramic materials (e.g., a blend of high density ceramic particles in a ceramic matrix); or a blend of a ceramic material and a metal (e.g., a blend of high density ceramic materials in a metal matrix).

In some embodiments in which the grinding media comprises more than one material component, the grinding media may comprise coated particles. The particles may have a core material and a coating formed on the core material. The coating typically completely covers the core material, but not in all cases. The composition of the core and coating materials may be selected to provide the grinding media with desired properties such as a high density. For example, the core material may be formed of a high density material (e.g., greater than 8 grams/cm$^3$). The core, for example, may be formed of a metal such as steel or depleted uranium; or a ceramic such as a metal carbide.

As noted above, particle compositions may be produced in a milling process that use grinding media as described herein. The processes may utilize a wide range of conventional mills having a variety of different designs and capacities. Suitable types of mills include, but are not limited to, ball mills, rod mills, attritor mills, stirred media mills, pebble mills and vibratory mills, among others.

In some cases, conventional milling conditions (e.g., energy, time) may be used to process the particle compositions using the grinding media described herein. In other cases, the grinding media described herein may enable use of milling conditions that are significantly less burdensome (e.g., less energy, less time) than those of typical conventional milling processes, while achieving a superior milling performance (e.g., very small average particle sizes).

One aspect of the invention is that the small particle compositions of the invention may be produced using very low specific energy input (i.e., energy consumed in milling process per weight of feed material).

Milling processes of the invention can involve the introduction of a slurry of feed material and a milling fluid (e.g., a fluid that does not react with the particle compositions) into a processing space in a mill in which the grinding media is confined. The viscosity of the slurry may be controlled, for example, by adding additives to the slurry such as dispersants. The mill is rotated at a desired speed and material particles mix with the grinding media. Collisions between the particles and the grinding media can reduce the size of the particles. The particles are typically exposed to the grinding media for a certain mill time after which the milled material is separated from the grinding media using conventional techniques, such as washing and filtering, screening or gravitation separation.

In some processes, the slurry of particles is introduced through a mill inlet and, after milling, recovered from a mill outlet. The process may be repeated and, a number of mills may be used sequentially with the outlet of one mill being fluidly connected to the inlet of the subsequent mill.

In some processes, the above-noted milled particle sizes are achieved when the feed material (prior to milling) has an average particle size of greater than 1 micron, greater than 10 micron, or even greater than 50 micron. In some processes, the average particle size of the feed material may be greater than 10 times, 50 times, 100 times, or even greater than 500 times the average particle size of the milled material. The specific particle size of the milled material depends on a number of factors including milling conditions (e.g., energy, time), though is also dictated, in part, by the application in which the milled material is to be used. In general, the milling conditions may be controlled to provide a desired final particle size. The particle size of the feed material may depend on commercial availability, amongst other factors.

The milled particles may be further processed as desired for the intended application. In some embodiments, the particles are processed to form thin films. In these cases, the particles may be dispersed in a liquid to form a slurry which is cast onto a substrate. The liquid phase may be evaporated to form a thin film. In some cases, the thin film is formed substantially of the particles; while, in other cases, the thin film is formed of nanoparticles distributed in a material (e.g., a polymeric material) to form a composite. For example, a polymeric material may be spun coat or otherwise cast, to form a layer that comprises a composite of polymeric material and nanoparticles.

In some cases, the thin films may have a thickness of less than 1 micron; in other cases, less than 100 nanometers. In some embodiments (e.g., when the thin film is formed substantially of the particles), the thin film may be characterized by grain boundaries that are staggered through the film thickness and are formed by respective particles. In certain embodiments, the shape of the particles (e.g., when platelets) may facilitate formation of the thin films. Particle crystallographic orientation which, as described above, may be in a preferred direction may lead to films formed from such particles also having that preferred crystallographic direction. It is believed that one or more of these characteristics can improve thin film properties including conductivity and light emission, amongst others. In these cases, it may be possible to use a thinner film to achieve the same properties as thicker films produced according to conventional deposition techniques.

It should be understood that the particles, including thin films formed from the particles, may be used in any suitable application. In particular, semiconductor and/or light-emitting applications are suitable.

The following example is intended to be illustrative and is not limiting.

Example 1

This example illustrates production of GaN nanoparticles in accordance with an embodiment of the present invention.

GaN nanoparticle compositions were produced in a milling process. The milling process used a Netzsch Lab Star mill (chamber capacity of 0.6 L) and tungsten carbide-based (e.g., W(Re)C) grinding media having a relatively high mass density and a size of between about 75 and 125 microns. The loading percentage of the grinding media in the milling chamber was about 70%. In an illustrative process, about 25 grams of ultra-high purity, low oxygen Eu-doped GaN having a particle size of about 10 microns was dispersed in approximately 250 grams of ethanol with a solids loading of 9% by weight. The specific energy applied to the slurry was 50,000 KJ/kg. Milled particles were produced and collected.

The milled particles were characterized using several techniques. The BET surface area was measured to be about 20 m$^2$/g using a Nova 2000 instrument. Particle size analysis was conducted using a DT 1200 instrument and an SEM. The average particle size was determined to be less than 100 nm and, in the range of 10-50 nm. FIG. 1 is a copy of an SEM image showing a representative portion of the milled GaN nanoparticle composition. Platelet shaped particles are shown in the image.

Figure 2:
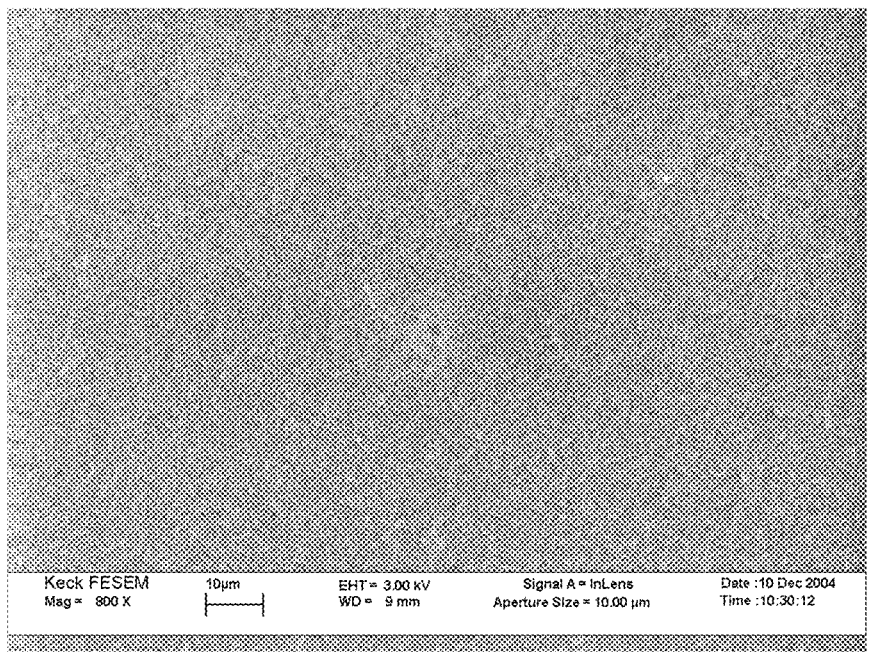
FIG. 2 is a copy of an SEM image of a thin film made in a spin-coating process using GaN nanoparticles as described in Example 1.

A thin film glass layer including the GaN particles was produced in a spin-on-glass process. FIG. 2 illustrates an SEM image of a thin film spin-coated using the nanoparticles.

Figure 3:
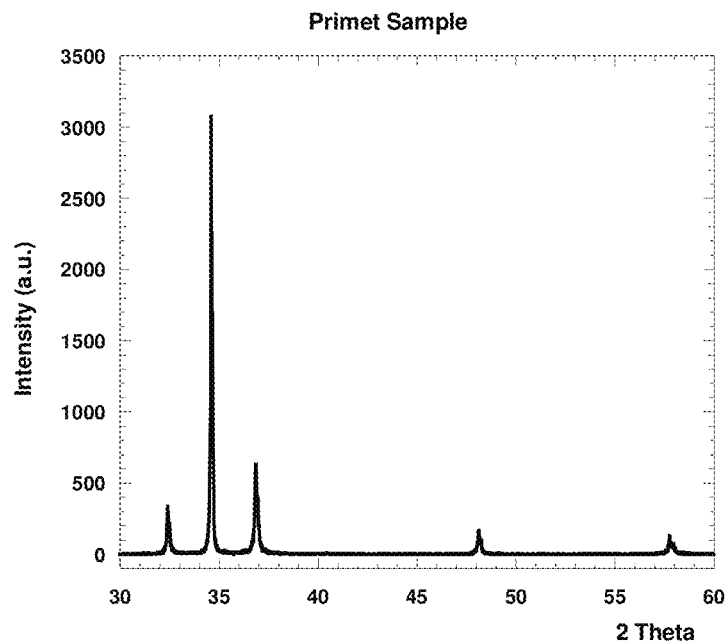
FIG. 3 is an XRD pattern of GaN nanoparticles as described in Example 1.
Figure 4:
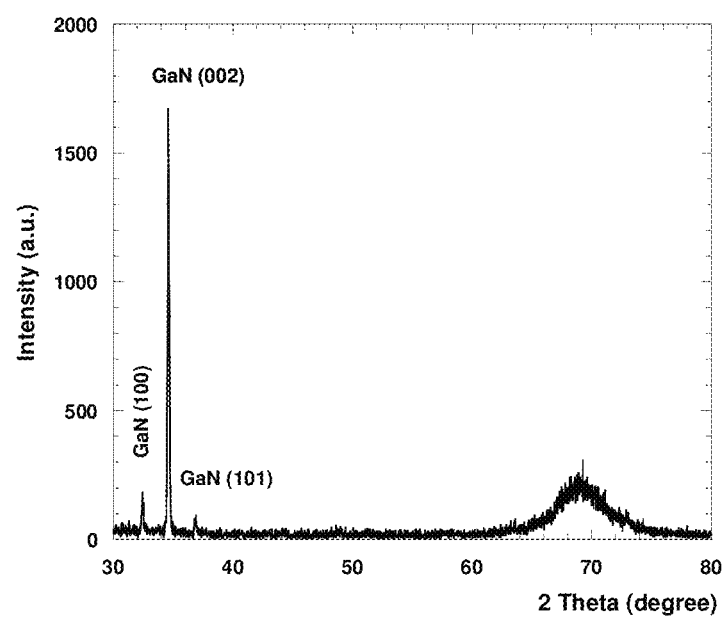
FIG. 4 is an XRD pattern of GaN nanoparticles in a spin-on-glass layer as described in Example 1.

XRD analysis indicated that the GaN particles had a strong preferred (002) orientation in both powder form (FIG. 3) and when incorporated in a spin-on-glass layer (FIG. 4). The XRD results indicated clear GaN peaks after processing and, thus, the particles maintained crystalline and chemical structure through processing. As shown, the XRD peak of (002) is much stronger compared to the other peaks, while the (110) peak is the strongest in standard powder sample. The (002) peak is the c-plane peak.

Figure 5A:
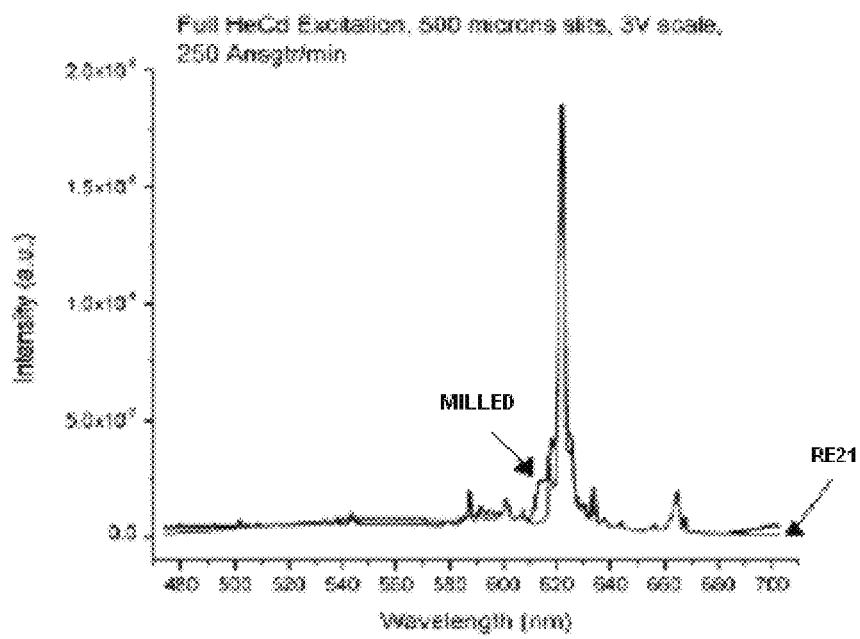
FIGS. 5A and 5B show a photoluminescence (PL) spectrum comparing non-milled GaN particles (RE21) and milled GaN nanoparticles as described in Example 1.
Figure 5B:
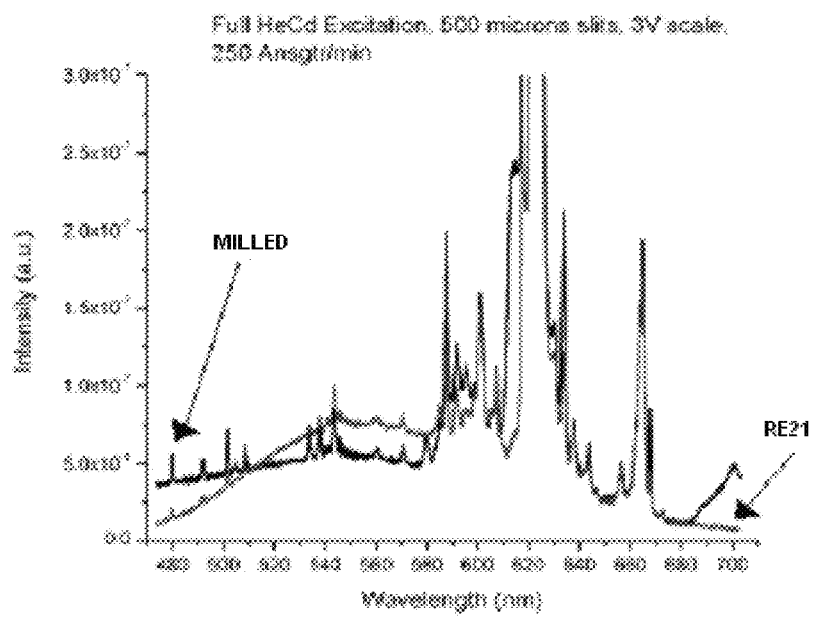

Photoluminescence (PL) analysis was done on thin films formed from GaN:Eu-doped (about 1% by weight Eu) particles before milling (RE21—particle size about 10 microns) and after milling (particle size in the range of 10-50 nm). PL Spectra are shown in FIGS. 5A and 5B. As shown, the milled nanoparticles form a more uniform and continuous thin film than non-milled particles using spin coating. The sample made from milled nanoparticles has excellent luminescent properties and the intensity of the milled nanoparticle sample is 20% more than the intensity of the non-milled particle sample (RE21). Clearer and sharper peaks were observed in the sample made from milled particles which are not present in the non-milled sample.

Having thus described several aspects and embodiments of this invention, it is to be appreciated various alterations, modifications and improvements will readily occur to those skilled in the art. Such alterations, modifications and improvements are intended to be part of this disclosure, and are intended to be within the spirit and scope of the invention. Accordingly, the foregoing description and drawings are by way of example only.

What is claimed is:

1. A particle composition comprising:
   milled particles comprising a semiconductor material and having an average particle size of less than 150 nm, wherein the particles have a platelet shape, wherein the platelet shape particles are formed in a milling process and a majority of the particles have a (002) crystallographic orientation.

2. The particle composition of claim 1, wherein the particles comprise a group III-V material.

3. The particle composition of claim 1, wherein the particles comprise a gallium nitride material.

4. The particle composition of claim 1, wherein the particles have an average particle size of less than 50 nm.

5. The particle composition of claim 1, wherein the particles comprise a light-emitting material.

6. The particle composition of claim 1, wherein the composition has a contamination level of less than 900 ppm.

7. A particle composition comprising:
   milled particles comprising a light-emitting material and having an average particle size of less than 150 nm, wherein the particles have a platelet shape, wherein the platelet shape particles are formed in a milling process and a majority of the particles have a (002) crystallographic orientation.

8. A thin film comprising:
   milled particles comprising a semiconductor material and having an average particle size of less than 150 nm, wherein the particles have a platelet shape, wherein the platelet shape particles are formed in a milling process and a majority of the particles have a (002) crystallographic orientation.

9. The thin film of claim 8, wherein the thin film comprises a composite comprising the particle composition and a polymeric material.

10. The thin film of claim 8, wherein the thin film includes a plurality of staggered grain boundaries.

11. The thin film of claim 8, wherein the thin film has a preferred crystallographic orientation in the same direction as the crystallographic orientation of the particles.

12. The thin film of claim 8, wherein the thin film has a (002) crystallographic orientation.

* * * * *